(12) United States Patent
Scholz et al.

(10) Patent No.: US 10,811,579 B2
(45) Date of Patent: Oct. 20, 2020

(54) OPTOELECTRONIC COMPONENT HAVING SIDE CONTACTS

(71) Applicant: OSRAM OLED GmbH, Regensburg (DE)

(72) Inventors: Dominik Scholz, Bad Abbach (DE); Siegfried Herrmann, Neukirchen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/073,605

(22) PCT Filed: Jan. 26, 2017

(86) PCT No.: PCT/EP2017/051679
§ 371 (c)(1),
(2) Date: Jul. 27, 2018

(87) PCT Pub. No.: WO2017/129697
PCT Pub. Date: Aug. 3, 2017

(65) Prior Publication Data
US 2019/0027666 A1 Jan. 24, 2019

(30) Foreign Application Priority Data

Jan. 29, 2016 (DE) .......................... 10 2016 101 652

(51) Int. Cl.
*H01L 33/62* (2010.01)
*H01L 21/56* (2006.01)
(Continued)

(52) U.S. Cl.
CPC ............ *H01L 33/62* (2013.01); *H01L 21/568* (2013.01); *H01L 24/04* (2013.01); *H01L 33/486* (2013.01);
(Continued)

(58) Field of Classification Search
CPC ....................................................... H01L 33/62
See application file for complete search history.

(56) References Cited

U.S. PATENT DOCUMENTS

| 2006/0208364 A1 | 9/2006 | Wang et al. |
| 2008/0099779 A1 | 5/2008 | Huang et al. |
| (Continued) | | |

FOREIGN PATENT DOCUMENTS

| CN | 201918389 | 8/2011 |
| CN | 104900608 | 9/2015 |
| (Continued) | | |

*Primary Examiner* — Daniel Whalen
(74) *Attorney, Agent, or Firm* — DLA Piper LLP (US)

(57) ABSTRACT

An optoelectronic component includes a light emitting semiconductor chip, including an emission side and comprising an underside, wherein the optoelectronic component is configured to emit light via the emission side, the optoelectronic component including an insulating layer, the light emitting semiconductor chip is embedded into the insulating layer, the light emitting semiconductor chip including two electrical contact locations, the contact locations face away from the emission side, a first and a second electrically conductive contact layer are provided, respectively, an electrically conductive contact layer electrically conductively connects to a contact location of the semiconductor chip, the electrically conductive contact layers are arranged in the insulating layer, the first electrically conductive contact layer adjoins a first side face of the optoelectronic component, and the second electrically conductive contact layer adjoins a second side face of the optoelectronic component.

19 Claims, 10 Drawing Sheets

(51) Int. Cl.
*H01L 33/48* (2010.01)
*H01L 23/00* (2006.01)

(52) U.S. Cl.
CPC  *H01L 2224/04105* (2013.01); *H01L 2224/19* (2013.01); *H01L 2924/18162* (2013.01); *H01L 2933/0066* (2013.01)

(56) References Cited

U.S. PATENT DOCUMENTS

| | | |
|---|---|---|
| 2009/0262516 A1 | 10/2009 | Li |
| 2009/0283881 A1* | 11/2009 | Wang ................ H01L 24/19 257/676 |
| 2013/0069102 A1 | 3/2013 | Kimura et al. |
| 2013/0292812 A1* | 11/2013 | Seo .................. H01L 23/49541 257/676 |
| 2014/0226345 A1 | 8/2014 | Song et al. |
| 2014/0284634 A1 | 9/2014 | Hirao et al. |
| 2015/0001563 A1* | 1/2015 | Miki ..................... H01L 33/54 257/98 |
| 2015/0255685 A1 | 9/2015 | Herrmann et al. |
| 2016/0087161 A1 | 3/2016 | Wirth et al. |
| 2016/0218261 A1 | 7/2016 | Moosburger et al. |
| 2016/0225964 A1 | 8/2016 | Schwarz et al. |

FOREIGN PATENT DOCUMENTS

| | | |
|---|---|---|
| DE | 10 2012 217 533 | 3/2014 |
| DE | 10 2013 207 611 | 10/2014 |
| DE | 10 2013 110 114 | 4/2015 |
| DE | 10 2013 110 733 | 4/2015 |

\* cited by examiner

OPTOELECTRONIC COMPONENT HAVING SIDE CONTACTS

TECHNICAL FIELD

This disclosure relates to an optoelectronic component comprising a light emitting semiconductor chip, in particular, a semiconductor chip comprising two rear contacts such as a flip-chip or a surface emitter comprising two rear contacts.

BACKGROUND

Optoelectronic components comprising a light emitting semiconductor chip comprising rear contacts may be realized by introducing the light emitting chip into an insulating material, subsequently removing the insulating material again in the region of the rear contacts of the semiconductor chip and producing soldering surfaces on the component rear side, which electrically conductively connect to the rear contacts of the semiconductor chip. In such a case, the position and arrangement of the soldering surfaces is limited by the chip geometry and has to be implemented on a very small space.

It could therefor be helpful to provide an improved optoelectronic component in which the electrical contacting of the rear contacts of the semiconductor chip is led out laterally from the component. Soldering surfaces whose position is not limited by the chip geometry on the component rear side may be provided as a result. It could also be helpful to provide a production method for such an optoelectronic component.

SUMMARY

We provide an optoelectronic component including a light emitting semiconductor chip, including an emission side and comprising an underside, wherein the optoelectronic component is configured to emit light via the emission side, the optoelectronic component comprises an insulating layer, the light emitting semiconductor chip is embedded into the insulating layer, the light emitting semiconductor chip comprises two electrical contact locations, the contact locations face away from the emission side, a first and a second electrically conductive contact layer are provided, respectively, an electrically conductive contact layer electrically conductively connects to a contact location of the semiconductor chip, the electrically conductive contact layers are arranged in the insulating layer, the first electrically conductive contact layer adjoins a first side face of the optoelectronic component, and the second electrically conductive contact layer adjoins a second side face of the optoelectronic component.

We also provide a method of producing an optoelectronic component including providing a semiconductor chip or a flip-chip or a surface emitter comprising rear contacts; embedding the semiconductor chip or the flip-chip into a first electrically insulating layer; applying two electrically conductive contact layers on the first insulating layer such that the electrically conductive contact layers are insulated from one another and respectively connect to an electrical contact location of the semiconductor chip; and applying a second electrically insulating layer that covers the electrically conductive contact layers.

LIST OF REFERENCE SIGNS

Figure 1:
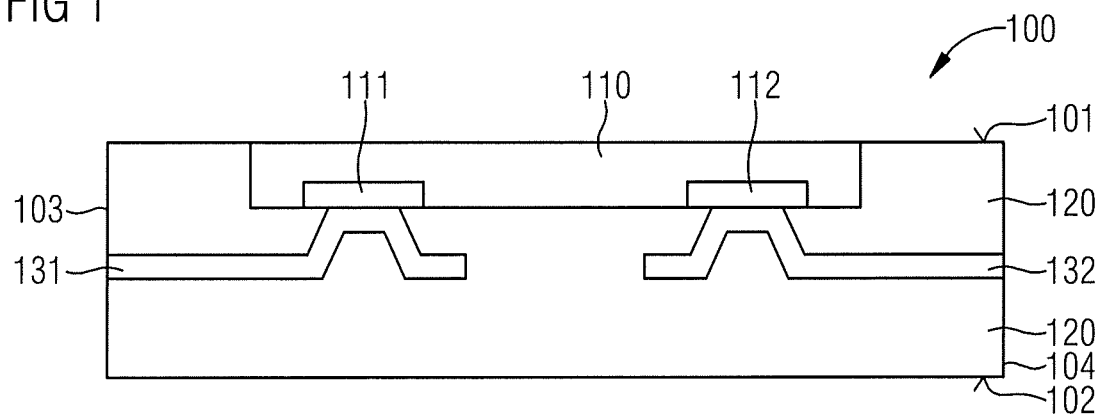
FIG. 1 schematically shows a cross section through an optoelectronic component.

100 Optoelectronic component
101 Emission side
102 Underside
103 First side face
104 Second side face
105 First edge
106 Second edge
107 Front side
108 Rear side
109 Further edges
110 Light emitting semiconductor chip
111 First contact location
112 Second contact location
113 Intermediate region
114 Substrate
120 Insulating layer
121 First layer
122 Second layer
123 First recess
124 Second recess
131 First conductive contact layer
132 Second conductive contact layer 141 First electrically conductive layer
142 Second electrically conductive layer
150 Metal layer
160 Conversion element
161 Frame
162 Recess
170 ESD diode

DETAILED DESCRIPTION

Our optoelectronic component comprises a light emitting semiconductor chip comprising an emission side and an underside. The component is configured to emit light via the emission side. Moreover, the optoelectronic component comprises an insulating layer in which the semiconductor chip is embedded. The semiconductor chip comprises two electrical contact locations facing away from the emission side. Within the insulating layer, a first and a second electrically conductive contact layer are provided that electrically conductively connect respectively to a contact location of the semiconductor chip. The first electrically conductive contact layer adjoins a first side face of the optoelectronic component. The second electrically conductive contact layer adjoins a second side face of the optoelectronic component. In this case, the side faces, that is to say the first and second side faces, are neither the emission side nor the underside of the optoelectronic component. By virtue of the fact that the electrically conductive contact layers of the optoelectronic component adjoin different side faces of the optoelectronic component, a chip geometry is achieved that has the result that short circuits in the course of soldering the optoelectronic component during a mounting process are very unlikely. Furthermore, with the optoelectronic component specified, it is possible to achieve good mechanical stability thereof.

A first electrically conductive layer may be arranged on the first side face, the first electrically conductive layer being connected to the first electrically conductive contact layer. A second electrically conductive layer is arranged on the second side face, the second electrically conductive layer being connected to the second electrically conductive contact layer. In this case, the first electrically conductive layer and the second electrically conductive layer may consist of metal and thus form the soldering locations of the optoelectronic semiconductor component.

The optoelectronic component may comprise a metal layer on the underside, wherein the metal layer is configured in particular to connect to a carrier. The metal layer on the underside may either be electrically insulated from both electrically conductive contact layers or electrically conductively connect to one of the two electrically conductive contact layers. In this case, the metal layer serves as a further soldering surface by which the component may be mechanically and/or electrically connected to a carrier. If the metal layer does not electrically connect to the electrically conductive contact layers, this enables a precise mounting of the optoelectronic component, without an electrical contacting taking place in this case. This is advantageous during mounting of the finished optoelectronic component.

The insulating layer may comprise a first and a second layer. The electrically conductive contact layers are arranged between the first and second layers of the insulating layer. The first and/or the second layer comprise(s) in particular a mold material. Insulating layers comprising mold material are particularly simple to produce and therefore advantageous. By dividing the insulating layer into two layers, simple production of the optoelectronic component may be made possible, which will be discussed in greater detail in the method of producing the optoelectronic component.

The layer may comprise a circuit board material and/or a film. Such materials are also well suited to embedding semiconductor chips in an insulating material within an optoelectronic component.

The optoelectronic component may comprise a conversion element, wherein the conversion element is arranged at the emission side of the component. The conversion element is configured to convert light emitted by the semiconductor chip into light comprising a different wavelength. In addition, a frame is provided that laterally surrounds the conversion element, wherein the frame comprises a further insulating material. The insulating material of the frame may be in particular a material that deviates from the material of the insulating layer. Titanium dioxide may be used, for example, as material for the frame since titanium dioxide on account of its white color and enables a frame for an optoelectronic component that is advantageous in terms of the optical properties.

The first and second electrically conductive layers may adjoin the frame. As a result, it is possible to achieve a soldering surface as large as possible at the side faces of the optoelectronic component.

The first electrically conductive contact layer and the second electrically conductive contact layer may connect to one another via an ESD diode. The ESD diode and the semiconductor chip connect in antiparallel in this case and the ESD diode is embedded into the electrically insulating layer. The antiparallel connection of semiconductor chip and ESD diode leads to a more resistant optoelectronic component since a voltage applied to the optoelectronic component counter to the forward direction of the semiconductor chip may drain away via the ESD diode and the risk of damage to the semiconductor chip is thus reduced.

The first electrically conductive layer and/or the second electrically conductive layer and/or the metal layer may be arranged over an edge of the optoelectronic component on two sides of the optoelectronic component. Such an arrangement, the first and/or the second electrically conductive layer, has the effect that the component may be contacted both from the side faces and from the underside. By contrast, if the metal layer is arranged over an edge of the optoelectronic component on two sides, mounting of the optoelectronic component such that different emission directions become possible is simplified.

The semiconductor chip may comprise between the contact locations a region without metallization. The first electrically conductive contact layer extends within the insulating layer perpendicularly under the region without metallization of the semiconductor chip. As a result, the mechanical stability of the optoelectronic component may be further increased since the region without metallization of the semiconductor chip is mechanically supported by the metal of the first electrically conductive contact layer, without adversely affecting the electrical contactability of the semiconductor chip.

Our method of producing an optoelectronic component comprises:

providing a semiconductor chip, in particular a flip-chip or a surface emitter comprising rear contacts;

embedding the semiconductor chip into a first electrically insulating layer;

applying two electrically conductive contact layers on the first insulating layer such that the electrically conductive contact layers are insulated from one another and respectively connect to an electrical contact location of the semiconductor chip; and applying a second electrically insulating layer that covers the electrically conductive contact layers.

An optoelectronic component produced by this method comprises electrically conductive contact layers not connected to an underside of the optoelectronic component, as a result of which the described advantages of the optoelectronic component may be realized.

After embedding the semiconductor chip into the first electrically insulating layer, the electrical contact locations of the chip are exposed by removing material of the first insulating layer. This is advantageous in particular if the first electrically insulating layer is intended not only to be formed as a frame around the semiconductor chip, but also to extend over a region below the semiconductor chip. In this case, applying the first electrically insulating layer prevents a direct contacting of the contact locations of the semiconductor chip since the latter are covered by the first electrically insulating layer. Removing material enables the contact locations of the semiconductor chip to be exposed as a result of which the contacting is made possible.

The method may comprise the following further steps:

exposing the electrically conductive regions in marginal regions of the optoelectronic component; and applying a metallization of the exposed electrically conductive regions.

As a result, it is possible to produce soldering surfaces on the side regions of the optoelectronic component as a result of which a simple contacting of the optoelectronic component is made possible.

Exposing the electrically conductive regions in the marginal regions of the optoelectronic component may be carried out by a saw cut. In this case, the saw cut is carried out such that the saw blade severs the electrically conductive contact layers and thus exposes them at this location. The subsequent metallization enables a direct contacting of these exposed locations of the electrically conductive contact layer.

Before applying the second electrically insulating layer, an ESD diode may be applied on the first insulating layer, wherein a respective terminal of the ESD diode connects to a respective electrically conductive contact layer. As a result, it is possible to produce an optoelectronic component in which the ESD diode is embedded into the component and, consequently, is no longer visible externally.

The first insulating layer may be roughened before applying the second insulating layer. This is advantageous since, as a result, the second electrically insulating layer adheres better to the first electrically insulating layer and the component thus becomes mechanically stabler.

The semiconductor chip may be arranged on a substrate. A further method step consists of removing the substrate after embedding the semiconductor chip into the first electrically insulating layer, in particular by an etching process. This is advantageous if the semiconductor chip, by virtue of the substrate, is processable more simply, in particular may be gripped more simply and may be positioned more simply as a result. Moreover, provision may be made for a recess to arise within the optoelectronic component as a result of removing the substrate, which recess may then be filled with a conversion material to obtain an optoelectronic component comprising a conversion element.

The above-described properties, features and advantages and the way in which they are achieved will become clearer and more clearly understood in association with the following description of examples explained in greater detail in association with the drawings.

FIG. 1 shows a cross section through an optoelectronic component 100 comprising an emission side 101 and an underside 102. In this case, the emission side 101 is arranged opposite the underside 102. A light emitting semiconductor chip 110 is arranged in a manner adjoining the emission side 101 such that light of the light emitting semiconductor chip 110 of the optoelectronic component 100 may be emitted via the emission side 101. Moreover, the optoelectronic component 100 comprises an insulating layer 120 into which the light emitting semiconductor chip 110 is embedded. The light emitting semiconductor chip 110 comprises two electrical contact locations, a first electrical contact location 111 and a second electrical contact location 112. In this case, the electrical contact locations 111, 112 are arranged on the side of the semiconductor chip 110 facing away from the emission side 101. It is likewise possible for the contact locations 111, 112 to be arranged laterally at the light emitting semiconductor chip 110. A first electrically conductive contact layer 131 is arranged within the insulating layer 120 and connected to the first contact location 111 of the light emitting semiconductor chip 110. A second electrically conductive contact layer 132 electrically conductively connects to the second contact location 112 of the light emitting semiconductor chip 110 and likewise arranged within the insulating layer 120. In this case, the first electrically conductive contact layer 131 is led to a first side face 103 of the optoelectronic component 100. In this case, the second electrically conductive contact layer 132 is led to a second side face 104 of the optoelectronic component 100. As a result, the first electrically conductive contact layer 131 may be electrically contacted at the first side face 103, and the second electrically conductive contact layer 132 may be electrically contacted at the second side face 104. As a result, the semiconductor chip 110 may also be electrically contacted, wherein the optoelectronic component 100 is thereby enabled to emit light.

Figure 2:
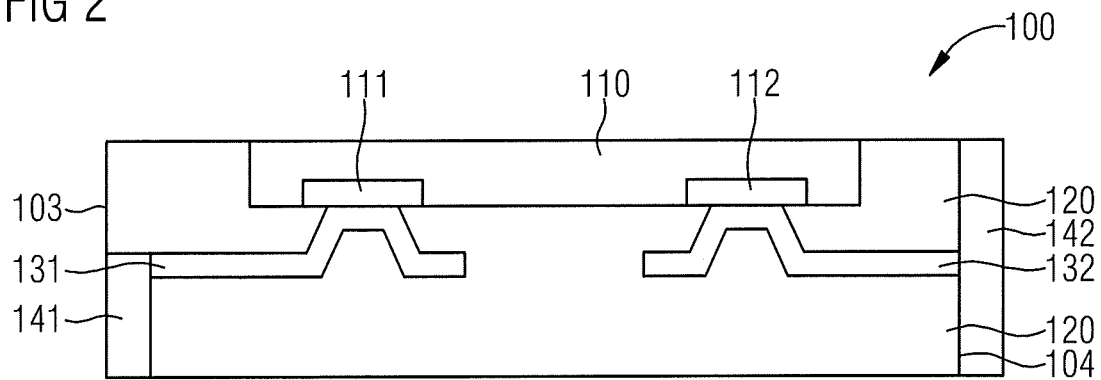
FIG. 2 schematically shows a cross section through an optoelectronic component comprising metallized side faces.

FIG. 2 shows a further cross section through an optoelectronic component 100 comprising the features of the optoelectronic component 100 from FIG. 1. Furthermore, the optoelectronic component 100 comprises a first electrically conductive layer 141 at the first side face 103. The first electrically conductive layer 141 electrically conductively connects to the first electrically conductive contact layer 131 and enlarges the contact region at the first side face 103. In this case, the first electrically conductive layer 141 is not formed over the entire first side face 103, but rather only over a partial region. A second electrically conductive layer 142 is arranged on the second side face 104, the second electrically conductive layer being electrically conductively connected to the second electrically conductive contact layer 132. In this case, the second electrically conductive layer 142 is arranged over the entire second side face 104 such that a contacting layer that is as large as possible arises at the second side face 104, the contacting layer corresponding to the second electrically conductive layer 142. It is likewise possible to provide on the first side face 103 a first electrically conductive layer 141 configured in exactly the same way as the second electrically conductive layer 142 in FIG. 2. It is likewise possible, on the second side face 104, for the second electrically conductive layer 142 to be configured in the same way as the first electrically conductive layer 141 in FIG. 2. Further combinations or arrangements of the electrically conductive layers 141, 142 may also be provided.

Figure 3:
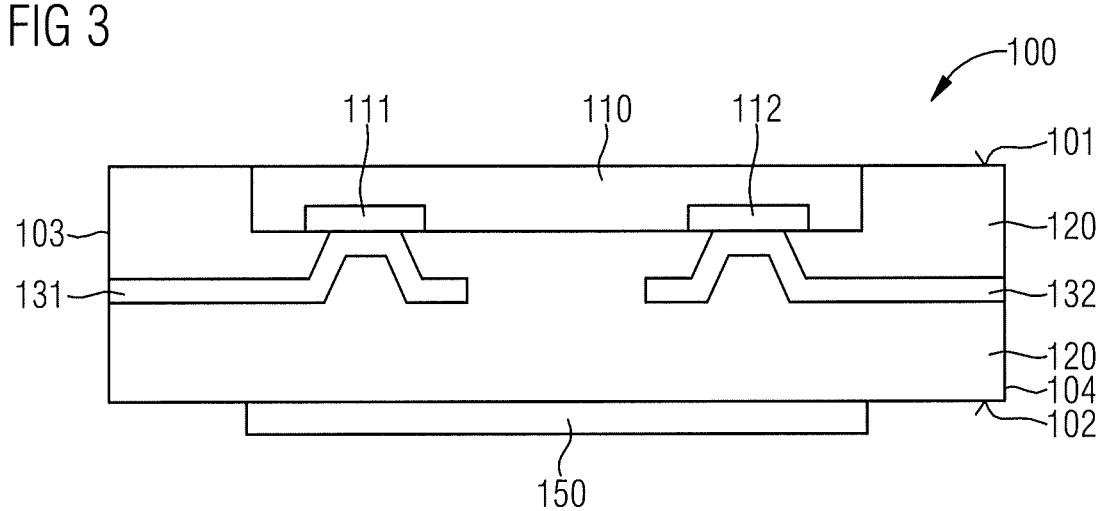
FIG. 3 schematically shows a cross section through an optoelectronic component comprising a metal layer at the underside.

FIG. 3 shows a cross section through an optoelectronic component 100 which substantially corresponds to the optoelectronic component from FIG. 1. In addition, a metal layer 150 is arranged on the underside 102. The metal layer 150 does not electrically conductively connect either to the first electrically conductive contact layer 131 or to the second electrically conductive contact layer 132, but is rather insulated from the contact layers 131, 132. The metal layer 150 is e.g. configured to connect to a carrier. This may be carried out by a soldering process, for example, wherein, in this case, the metal layer 150 is well suited to soldering the component on a support, for example, a circuit board or some other carrier.

Figure 4:
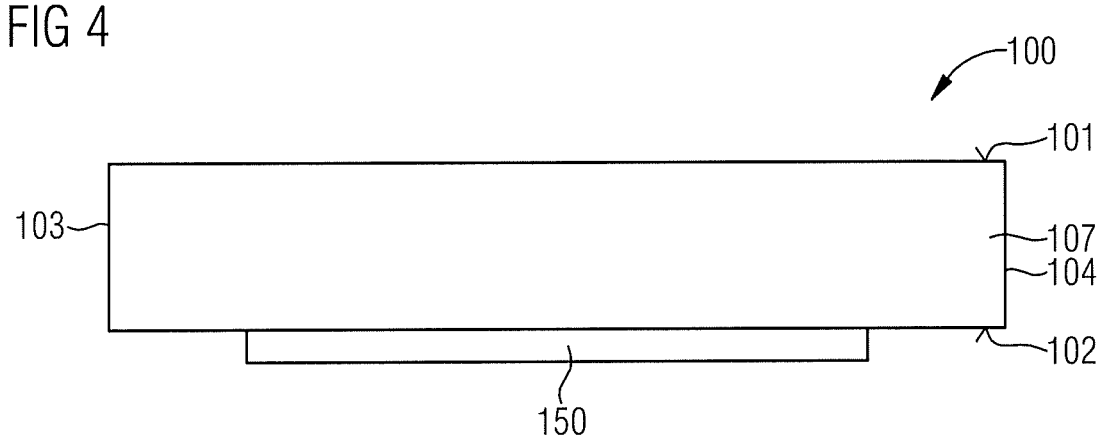
FIG. 4 schematically shows a side view of an optoelectronic component comprising a metal layer at the underside.

FIG. 4 shows a side view of the optoelectronic component 100 from FIG. 3. The optoelectronic component 100 is embedded into the electrically insulating layer 120 such that only the front side 107 of the optoelectronic component 100 is visible. The front side 107 homogeneously consists of the material of the electrically insulating layer 120. The metal layer 150 is arranged at the underside 102.

Figure 5:
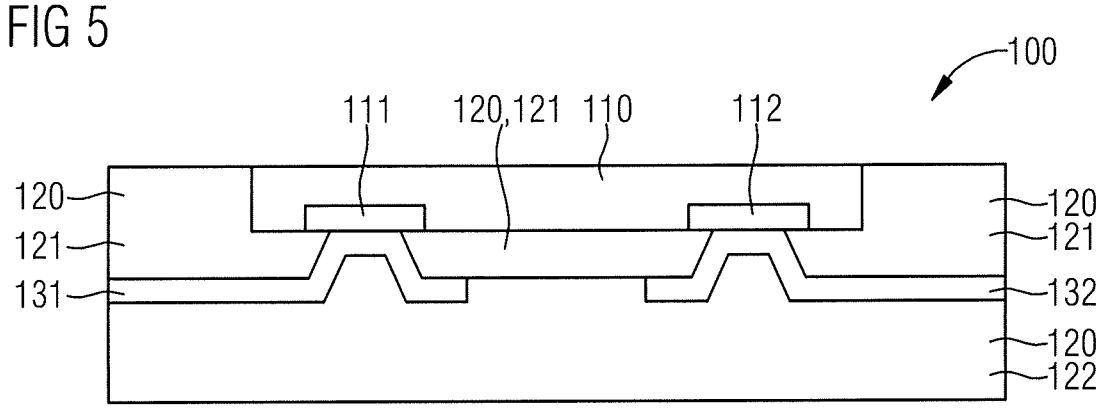
FIG. 5 schematically shows a cross section through an optoelectronic component in which the insulating layer is constructed from two layers.

FIG. 5 shows a further cross section through an optoelectronic component 100. This optoelectronic component 100 substantially corresponds to the component from FIG. 1. In contrast to FIG. 1, in this example, the electrically insulating layer 120 is constructed from a first layer 121 and a second layer 122. The semiconductor chip 110 is embedded into the first layer 121. The first and second electrically conductive contact layers 131, 132 adjoin the first layer 121. The second layer 122 adjoins the first layer 121 and also the electrically conductive contact layers 131, 132. The electrically conductive contact layers 131, 132 are arranged between the first layer 121 and the second layer 122. Mold materials, that is to say plastics, circuit board material or films, are appropriate as materials for the electrically insulating layer 120, the first layer 121 and the second layer 122. In this case, the material to be used is chosen as desired according to the requirements and material combinations are also used.

Figure 6:
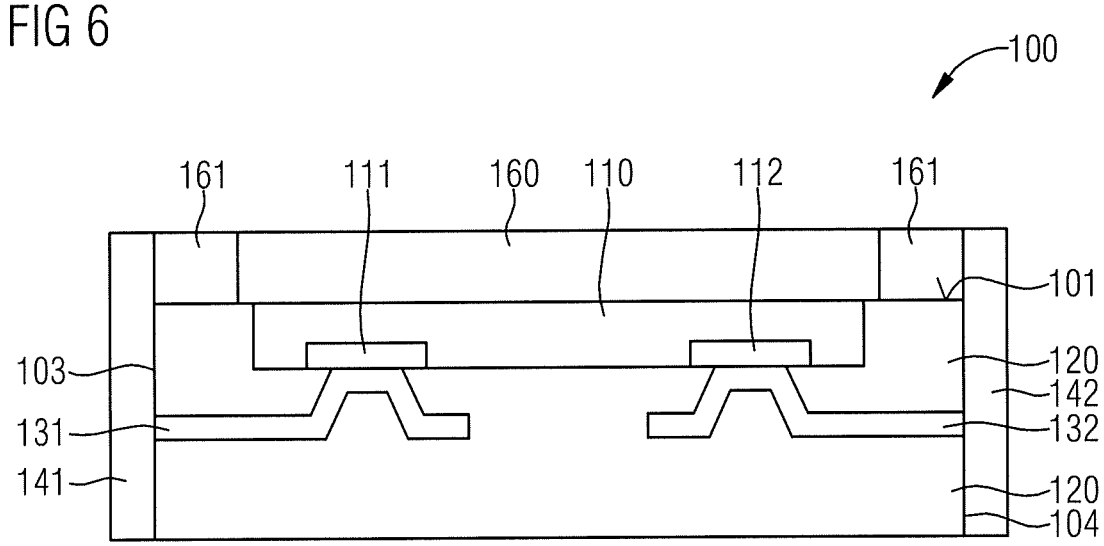
FIG. 6 schematically shows an optoelectronic component comprising a conversion element and a metallization on the entire side faces.

FIG. 6 shows a cross section through a further optoelectronic component 100 comprising the features of FIG. 1. In addition, a conversion element 160 is arranged on the emission side 101, the conversion element comprising an outer frame 161. In this case, an underside of the conversion element 160 adjoins the light emitting semiconductor chip 110. The frame 161 is arranged on the electrically insulating layer 120. The first electrically conductive layer 141 extends over the entire first side face 103, that is to say also over the frame 161 at the first side face 103. The second electrically conductive layer 142 extends over the entire second side face 104, that is to say also over the frame 161 at the second side face 104.

Figure 7:
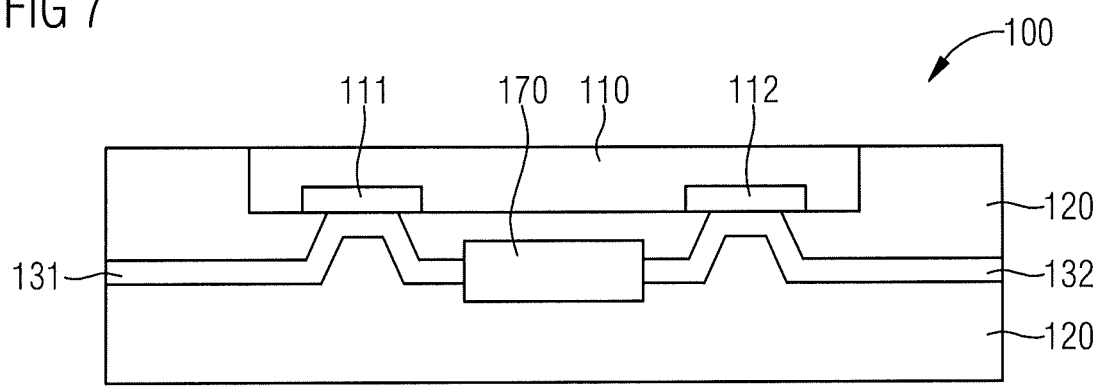
FIG. 7 schematically shows a cross section through an optoelectronic component comprising an ESD diode.

FIG. 7 shows a further cross section through an optoelectronic component 100 comprising the features of FIG. 1. In addition, an ESD diode 170 is arranged between the first conductive contact layer 131 and the second electrically conductive contact layer 132. The ESD diode 170 connects in antiparallel with the light emitting semiconductor chip 110. As a result, in an inadvertent or intentional polarity reversal of the voltage supply of the optoelectronic component 100, the current may drain away via the ESD diode 170 without damaging the light emitting semiconductor chip 110. In this example, an optoelectronic component 100 is presented which enables an areally compact design, this being detrimental, however, to the thickness of the component 200.

Figure 8:
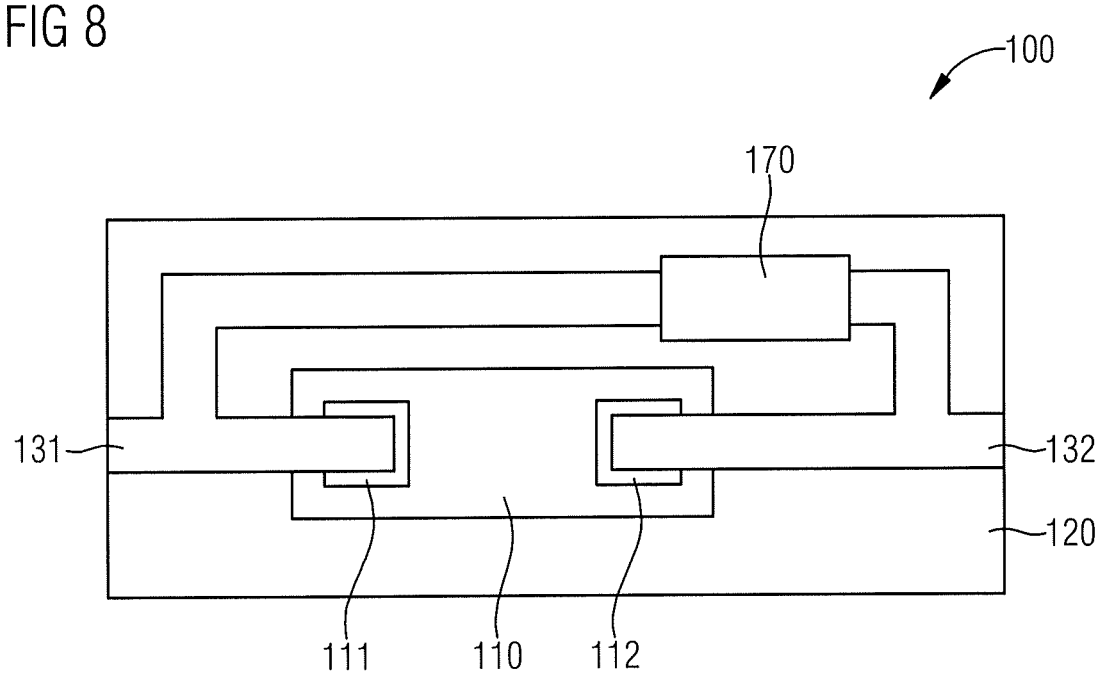
FIG. 8 schematically shows a further cross section through an optoelectronic component comprising an ESD diode.

FIG. 8 shows a further cross section through an optoelectronic component 100 comprising the features of FIG. 7. In this example, however, the ESD diode is not arranged below the light emitting semiconductor chip 110 in the insulating layer 120, but rather alongside the light emitting semiconductor chip 110. As a result of the arrangement of the ESD diode 170 alongside the semiconductor chip 110, the thickness of the component 100 may be reduced. In return, the component 100 is areally larger than the component 100 from FIG. 7.

Figure 9:
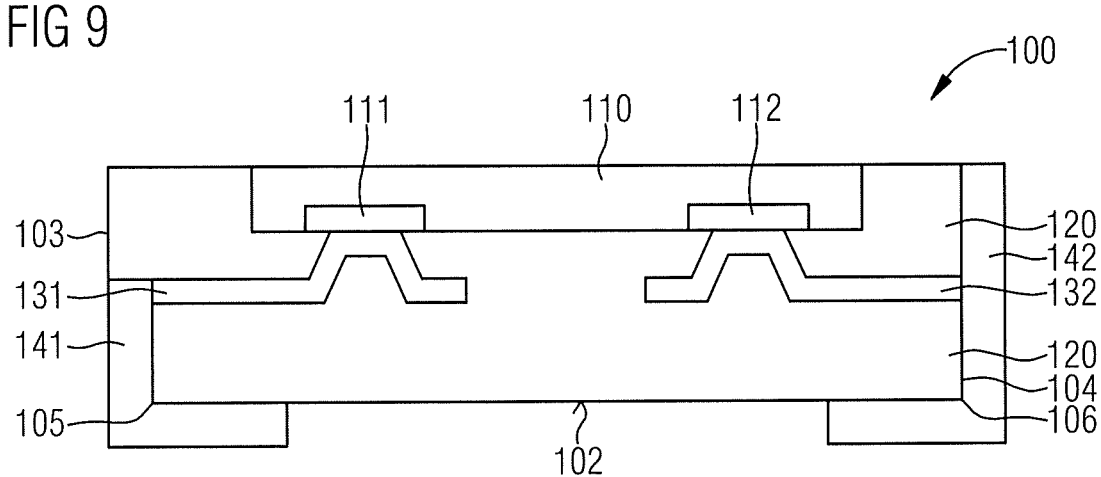
FIG. 9 schematically shows a cross section through an optoelectronic component in which the electrically conductive layers are arranged over an edge of the optoelectronic component on two sides.

FIG. 9 shows an optoelectronic component 100 comprising the features of FIG. 2. The underside 102 and the first side face 103 of the optoelectronic component 100 merge into one another at a first edge 105. The underside 102 and the second side face 104 merge into one another at a second edge 106. The first electrically conductive layer 141 extends from the first side face 103 over the first edge 105 onto the underside 102. The second electrically conductive layer 142 extends from the second side face 104 over the second edge 106 onto the underside 102. As a result, the optoelectronic component 100 may be contacted both via the first and second side faces 103, 104 and via the underside 102.

Figure 10:
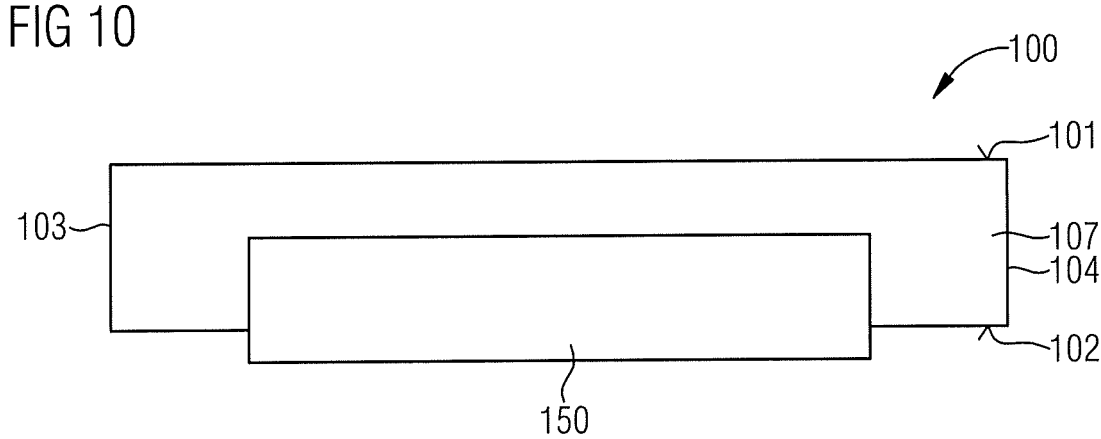
FIG. 10 schematically shows a side view of an optoelectronic component in which the metal layer is arranged over an edge on two sides.

FIG. 10 shows a side view of the front side 107 of an optoelectronic component 100 in which the metal layer 150 extends from the underside 102 over an edge onto the front side 107 of the optoelectronic component 100. As a result, the optoelectronic component 100 may also be arranged with the front side 107 downward on a carrier, as a result of which an emission direction of the optoelectronic component 100 parallel to the carrier is made possible.

Figure 11:
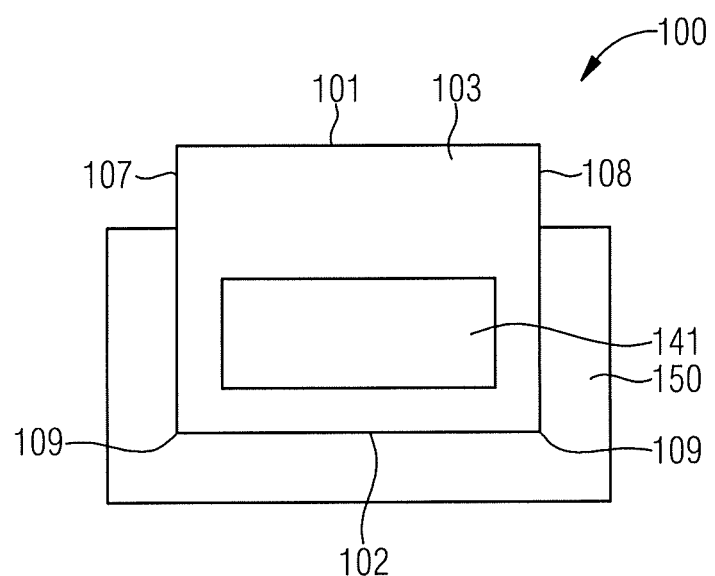
FIG. 11 schematically shows a further side view of an optoelectronic component in which the metal layer is arranged over an edge on two sides.

FIG. 11 shows a side view of the first side face 103 of the optoelectronic component 100 from FIG. 10. The metal layer 150 extends from the front side 107 over a further edge 109 onto the underside 102 and from there over a further edge 109 onto the rear side 108 of the optoelectronic component 100. If the optoelectronic component 100 is then arranged on a carrier not with the underside 102 downward, but rather in a manner rotated by 90° with the front side 107 downward, the emission side 101 does not face upward, but rather toward the left, as a result of which the light of the optoelectronic component 100 is emitted parallel to the carrier. It is likewise possible to mount the optoelectronic component 100 onto a carrier with the rear side 108 downward. Arranging the metal layer 150 on the underside 102, the front side 107 and the rear side 108 gives rise to an optoelectronic component very flexibly mountable on a carrier with different emission directions. By virtue of the fact that the metal layer 150 does not electrically conductively connect to the semiconductor chip 110, in this case, little consideration need be given to the electrical contacting of the optoelectronic component 100.

Figure 12:
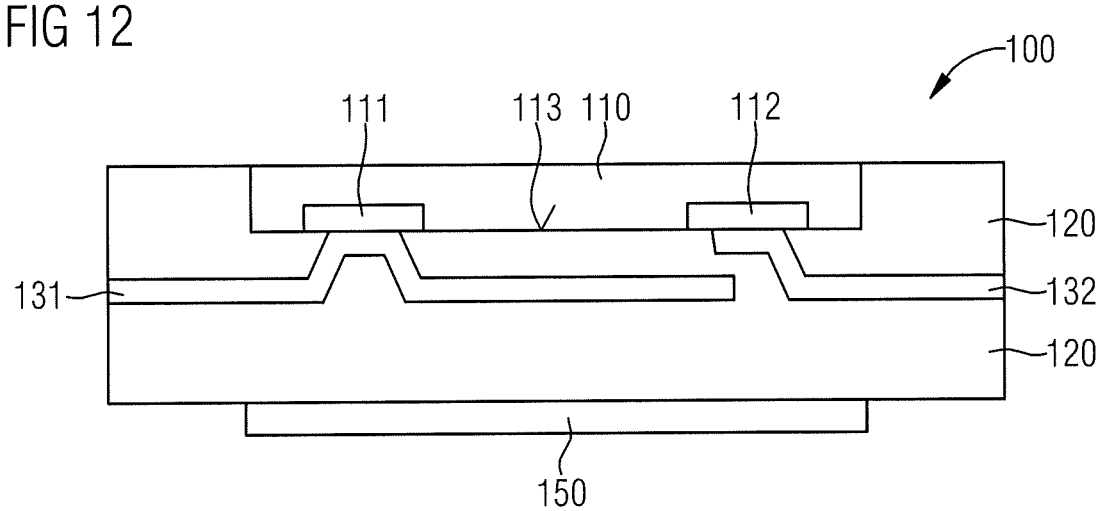
FIG. 12 schematically shows a cross section through an optoelectronic component in which an electrically conductive contact layer additionally mechanically stabilizes the optoelectronic component.

FIG. 12 shows a further cross section through an optoelectronic component 100 comprising the features of FIG. 1. The light emitting semiconductor chip 110 comprises an intermediate region 113 without metallization, the intermediate region being arranged between the first contact location 111 and the second contact location 112. The semiconductor chip 110 may be mechanically less stable in the intermediate region 113. To increase the mechanical stability of the optoelectronic component 100, the first electrically conductive contact layer 131 extends in the insulating layer 120 perpendicularly under the intermediate region 113 of the semiconductor chip 110. In addition, a metal layer 150 is arranged at the underside 102 of the optoelectronic component 100. As a result of the arrangement of the first contact layer 131 and the metal layer 150 below the intermediate region 113 of the semiconductor chip 110, the mechanical stability of the optoelectronic component 100 is increased since both the first electrically conductive contact layer 131 and the metal layer 150 mechanically support the intermediate region 113.

The features of the examples in FIGS. 1 to 12 may be combined arbitrarily with one another by those skilled in the art to obtain a further configuration of the optoelectronic component 100.

Figure 13:
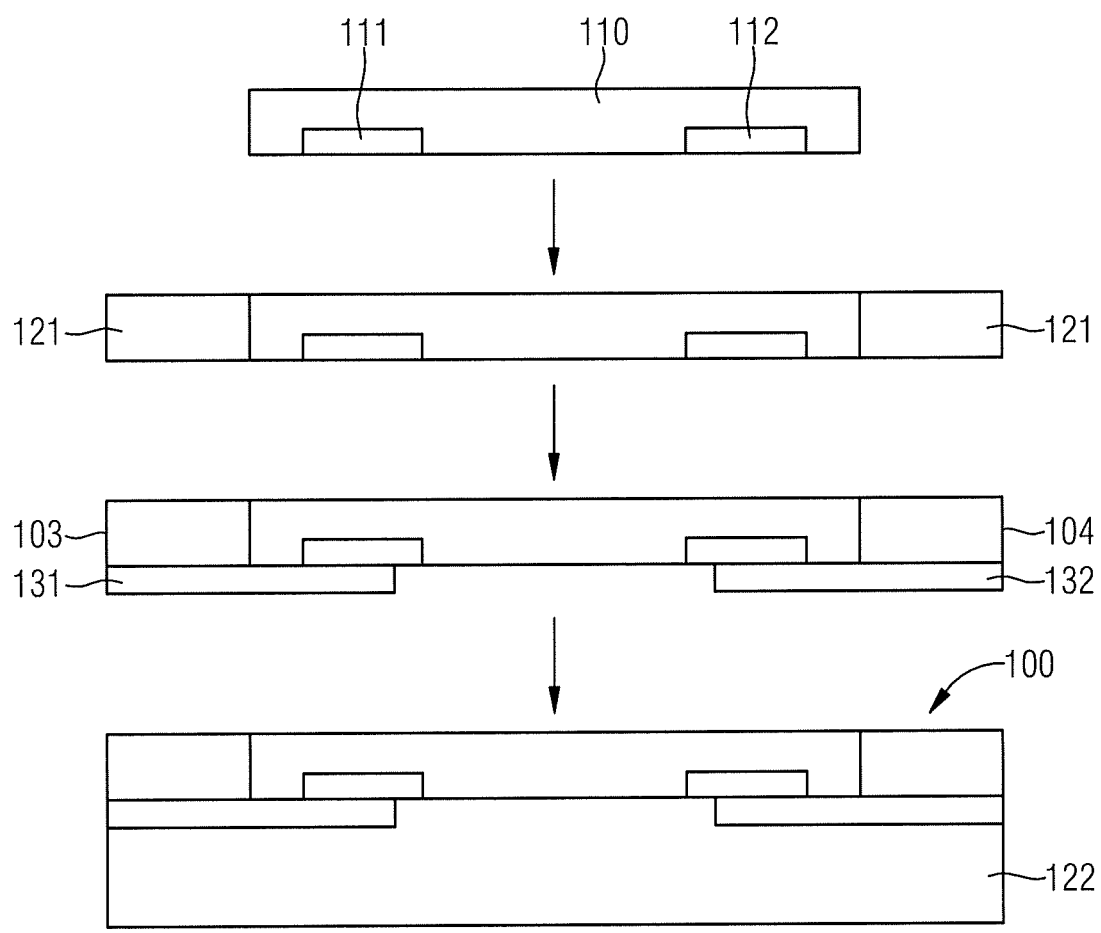
FIG. 13 schematically shows the sequence of the method of producing the optoelectronic component.

FIG. 13 shows a sequence of a method of producing an optoelectronic component comprising a plurality of method steps. In this case, the method steps are identified by arrows and the sequence of the method takes place from top to bottom. Cross sections of the intermediate products are illustrated in each case. First, a semiconductor chip 110 comprising a first contact location 111 and a second contact location 112 is provided. In this case, the semiconductor chip 110 is in particular a flip-chip or a surface emitter comprising rear contacts, which means that the first and second contact locations 111, 112 are situated on the side of the semiconductor chip 110 facing away from the light emission. In a next method step, the semiconductor chip 110 is laterally embedded into a first electrically insulating layer 121. The first electrically insulating layer 121 does not cover the underside of the semiconductor chip 110. In a next method step, a first electrically conductive contact layer 131 is applied on the first electrically insulating layer 121 and the semiconductor chip 110 such that the first contact layer 131 adjoins the first contact location 111 of the semiconductor chip 110. A second electrically conductive contact layer 132 is applied on the first electrically insulating layer 121 and the semiconductor chip 110 such that the second contact layer 132 adjoins the second contact location 112 of the semiconductor chip 110. The contact layers 131, 132 extend as far as the side faces 103, 104 of the component 100. In a last method step, a second electrically insulating layer 122 is applied, which covers the first electrically conductive contact layer 131 and the second electrically conductive contact layer 132.

Figure 14:
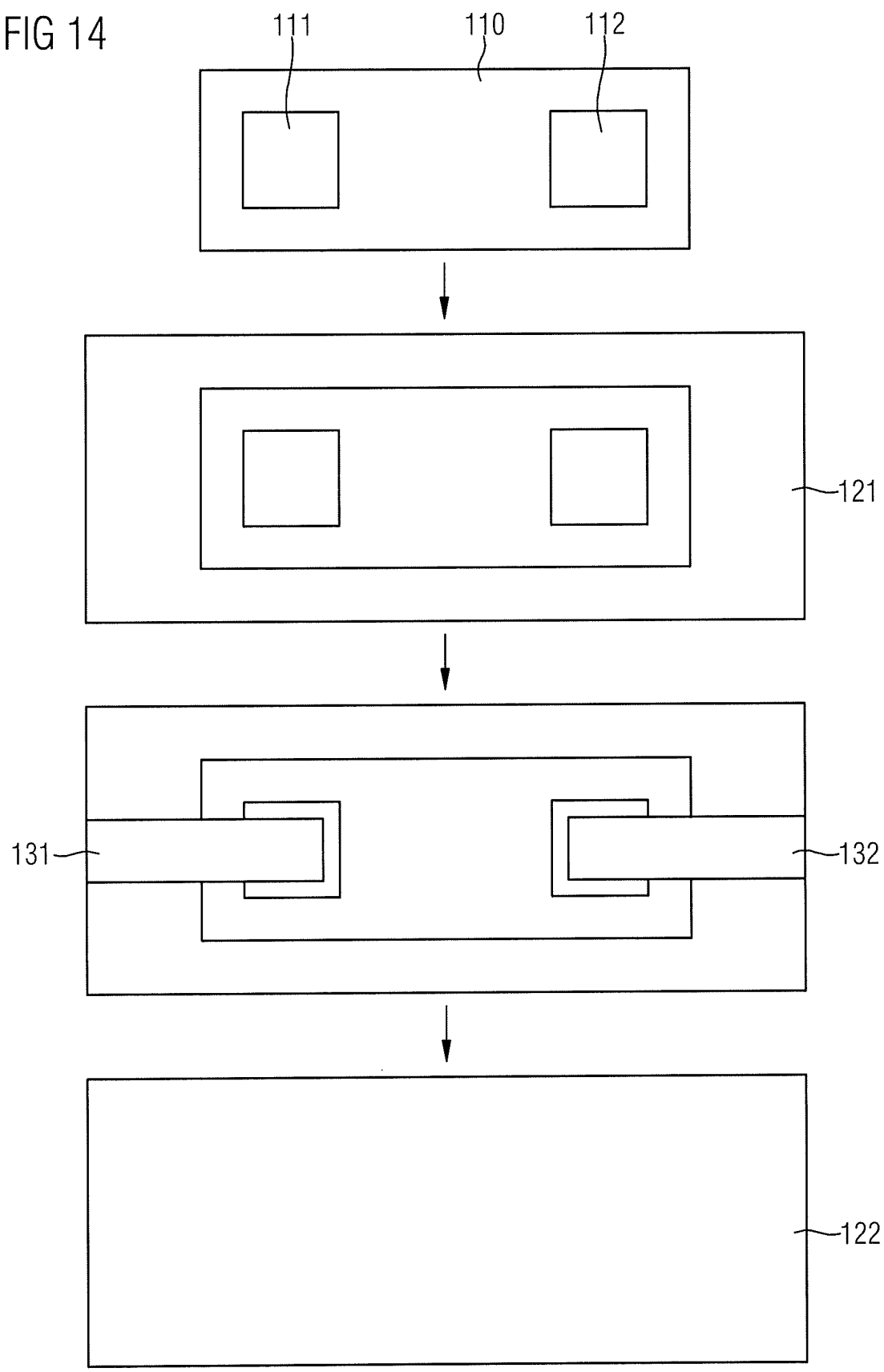
FIG. 14 likewise schematically shows the sequence of the method of producing the optoelectronic component.

FIG. 14 likewise shows the sequence of the method of producing an optoelectronic component comprising a plurality of method steps from FIG. 13. Plan views of the intermediate products from below are illustrated in each case. In this case, the method steps are identified by arrows and the sequence of the method takes place from top to bottom. A semiconductor chip 110 comprising the contact locations 111, 112 is embedded into a first electrically insulating layer 121. Afterward, the first electrically conductive contact layer 131 and a second electrically conductive contact layer 132 are applied on the first insulating layer 121 and the semiconductor chip 111. The first contact layer 131 adjoins the first contact location 111 of the semiconductor chip 110. The first contact layer 131 extends only over a partial region of the first insulating layer 121 and not over the entire width of the insulating layer 121. The second contact layer 132 adjoins the second contact location 112 of the semiconductor chip 110. The second contact layer 132 likewise extends only over a partial region of the first insulating layer 121. In a final method step, the second insulating layer 120 is applied and conceals the further features of the component 100 in the plan view from below. In the examples in FIGS. 1 to 12, the contact layers 131, 132 may be configured as described in FIG. 14. However, other forms of the contact layers 131, 132 are also possible.

Figure 15:
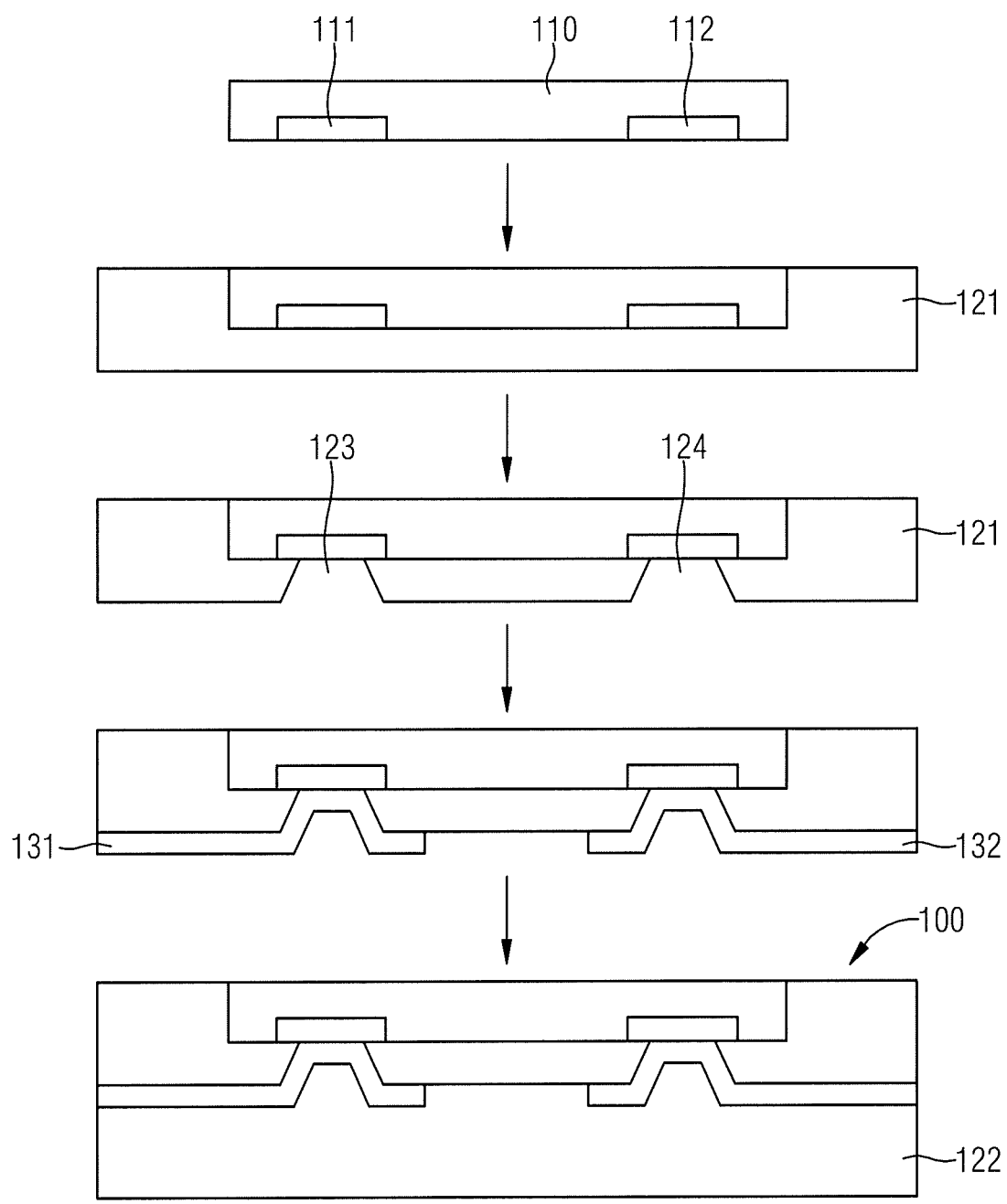
FIG. 15 schematically shows the sequence of a further method of producing the optoelectronic component comprising further steps.

FIG. 15 shows a further example of the method of producing an optoelectronic component 100, wherein once again, cross sections of the intermediate products are illustrated. First, a light emitting semiconductor chip 110 comprising two contact locations 111, 112 on the underside is likewise provided. In this example, the first insulating layer 121 covers the underside of the semiconductor chip 110 such that the first contact location 111 and the second contact location 112 are covered by the material of the first insulating layer 121. A next method step involves producing a first recess 123 of the first insulating layer 121 in the region of the first contact location 111 and a second recess 124 in the region of the second contact location 112. Producing the first recess 123 and the second recess 124 is carried out by removing the first insulating layer 121, for example, by drilling, etching or melting the material of the first insulating layer 121. Once again, the first electrically conductive contact layer 131 and the second electrically conductive contact layer 132 are then applied, which respectively touch the electrical contact locations 111, 112 of the semiconductor chip 110. The contact layers 131, 132 are once again led out laterally from the component 100. Afterwards, a second electrically insulating layer 122 is applied, which once again covers the electrically conductive contact layers 131, 132.

In one example, a metallization is applied on the electrically conductive contact layers 131, 132 in marginal regions of the optoelectronic component. In this case, in particular the example of the optoelectronic component 100 shown in FIG. 2 arises. In this case, the applied metallization corresponds to the electrically conductive layers 141, 142 in FIG. 2. In one example, provision is made of a saw cut and/or a grinding process before applying the metallization, by which a defined surface of the electrically conductive contact locations 131, 132 may be obtained.

In one example, before applying the second electrically insulating layer 122, an ESD diode 170 is applied on the first insulating layer 121. Respectively a terminal of the ESD diode 170 is connected to an electrically conductive contact layer 131, 132. In this case, polarization of the ESD diode 170 is intended to be antiparallel with respect to the polarization of the light emitting semiconductor chip 110.

In one example, the first insulating layer 121 is roughened before applying the second insulating layer 122 to improve adhesion of the second insulating layer 122 to the first insulating layer 121. In this case, roughening may be carried out by a grinding process or alternatively some other process.

Figure 16:
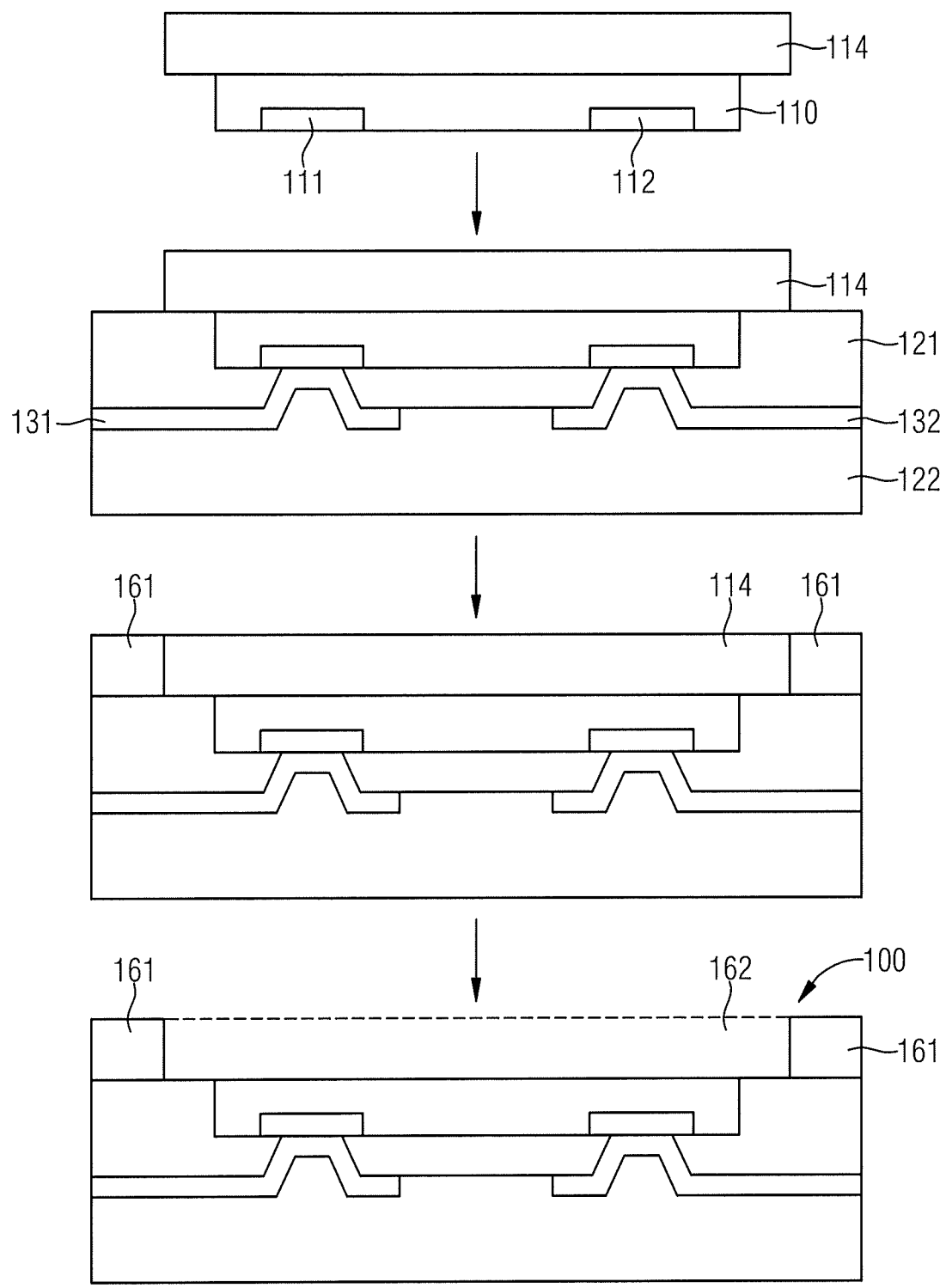
FIG. 16 shows schematically a method for producing an optoelectronic component in which the semiconductor chip was arranged on a substrate.

FIG. 16 shows a further example of the method of producing an optoelectronic component 100, wherein once again cross sections of intermediate products are illustrated. In this case, the light emitting semiconductor chip 110 is arranged by its emission side 101 on a substrate 114; the first contact location 111 and the second contact location 112 face away from the substrate 114. First, the first electrically insulating layer 121, the first electrically conductive contact layer 131, the second electrically conductive contact layer 132 and the second electrically insulating layer 122 are constructed analogously to FIG. 15. In this case, the substrate 114 projects from the first electrically insulating layer 121. In a next method step, a frame 161 is produced around the substrate 114, wherein the frame 161 adjoins the first electrically insulating layer 121. In this case, the thickness of the frame 161 corresponds to the thickness of the substrate 114. The frame 161 may be produced in a mold process, for example. In a further method step, the substrate 114 is removed, with the result that a recess 162 remains within the frame 161. In contrast to the illustration in FIG. 16, this method step may also already be carried out after applying the first insulating layer 121 or after further intermediate steps. The previous dimension of the substrate 114 is indicated by a dashed line in the region of the recess 162. In a next method step, the recess 162 then produced may then be filled with a conversion element 160 in order to arrive at the exemplary embodiment in FIG. 6.

Although our components and methods have been more specifically illustrated and described in detail by preferred examples, this disclosure is not restricted by the examples and other variations may be derived therefrom by those skilled in the art, without departing from the scope of protection of the appended claims.

This application claims priority of DE 10 2016 101 652.7, the subject matter of which is incorporated herein by reference.

The invention claimed is:

1. An optoelectronic component comprising:
a light emitting semiconductor chip comprising an emission side and comprising an underside, wherein the optoelectronic component is configured to emit light via the emission side, the optoelectronic component comprises an insulating layer, the light emitting semiconductor chip is embedded into the insulating layer, the light emitting semiconductor chip comprises two electrical contact locations, the contact locations face away from the emission side, first and second electrically conductive contact layers are provided, wherein each of the first and second electrically conductive contact layers electrically conductively connects to a corresponding contact location of the semiconductor chip, the electrically conductive contact layers are arranged in the insulating layer, the first electrically conductive contact layer adjoins a first side face of the optoelectronic component, and the second electrically conductive contact layer adjoins a second side face of the optoelectronic component;
a conversion element arranged at the emission side of the component; and
a frame that laterally surrounds the conversion element and comprises a further insulating material, wherein the frame directly adjoins the conversion element.

2. The optoelectronic component according to claim 1, further comprising a metal layer on the underside, wherein the metal layer is configured to connect to a carrier.

3. The optoelectronic component according to claim 2, wherein the metal layer is arranged over an edge of the optoelectronic component on two sides of the optoelectronic component.

4. The optoelectronic component according to claim 1, wherein the insulating layer comprises a first and a second layer and the electrically conductive contact layers are arranged between the first and second layers, and in the first and/or the second layer comprises a mold material.

5. The optoelectronic component according claim 1, wherein the insulating layer comprises at least one of circuit board material and a film.

6. The optoelectronic component according to claim 1, wherein a first electrically conductive layer is arranged on the first side face, the first electrically conductive layer being connected to the first electrically conductive contact layer, and a second electrically conductive layer is arranged on the second side face, said second electrically conductive layer being connected to the second electrically conductive contact layer.

7. The optoelectronic component according to claim 6, wherein at least one of the first electrically conductive layer and the second electrically conductive layer is arranged over an edge of the optoelectronic component on two sides of the optoelectronic component.

8. The optoelectronic component according to claim 1, wherein the first electrically conductive contact layer and the second electrically conductive contact layer adjoin the frame.

9. The optoelectronic component according to claim 1, wherein the first electrically conductive contact layer and the second electrically conductive contact layer connect to one another via an ESD diode, the ESD diode and the light emitting semiconductor chip connect in antiparallel, and the ESD diode is embodied into the electrically insulating layer.

10. The optoelectronic component according to claim 1, wherein the light emitting semiconductor chip comprises between the contact locations an intermediate region without metallization, and the first electrically conductive contact layer extends in the insulating layer perpendicularly under the intermediate region without metallization.

11. The optoelectronic component according to claim 1, wherein the frame and the insulating layer form a common plain first side face and a common plain second side face.

12. The optoelectronic component according to claim 11, wherein a first electrically conductive layer is arranged on the common first side face, the first electrically conductive layer being connected to the first electrically conductive contact layer, and a second electrically conductive layer is arranged on the common second side face, said second electrically conductive layer being connected to the second electrically conductive contact layer.

13. A method of producing an optoelectronic component comprising:
providing a semiconductor chip or a flip-chip or a surface emitter comprising rear contacts;
embedding the semiconductor chip or the flip-chip into a first electrically insulating layer;
applying two electrically conductive contact layers on the first insulating layer such that the electrically conductive contact layers are insulated from one another and respectively connect to an electrical contact location of the semiconductor chip;
applying a second electrically insulating layer that covers the electrically conductive contact layers;
forming a frame on the first electrically insulating layer, wherein the frame comprises a recess; and
filling the recess with a conversion element.

14. The method according to claim 13, wherein, after embedding the semiconductor chip into the first electrically insulating layer, the electrical contact locations of the chip are exposed by removing material of the first insulating layer.

15. The method according to claim 13, further comprising:
exposing the electrically conductive contact layers in marginal regions of the optoelectronic component; and
applying a metallization of the exposed electrically conductive contact locations.

16. The method according to claim 15, wherein exposing the electrically conductive contact locations in the marginal regions of the optoelectronic component is carried out by a saw cut.

17. The method according to claim 13, wherein, before applying the second electrically insulating layer, an ESD diode is applied on the first insulating layer, and a respective terminal of the ESD diode connects to a respective electrically conductive contact layer.

18. The method according to claim 13, wherein the first insulating layer is roughened before applying the second insulating layer.

19. The method according to claim 13, wherein the semiconductor chip is arranged on a substrate, a further method step consists of removing the substrate after embedding the semiconductor chip into the first electrically insulating layer by an etching process.

* * * * *